(12) United States Patent
Kitamura

(10) Patent No.: US 7,140,885 B2
(45) Date of Patent: Nov. 28, 2006

(54) HOUSING CASE FOR ELECTRONIC CIRCUIT BOARD

(75) Inventor: Nobuyuki Kitamura, Shioya-gun (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 11/157,846

(22) Filed: Jun. 22, 2005

(65) Prior Publication Data

US 2005/0287841 A1 Dec. 29, 2005

(30) Foreign Application Priority Data

Jun. 24, 2004 (JP) ............................. 2004-186621

(51) Int. Cl.
*H01R 12/00* (2006.01)

(52) U.S. Cl. .................. 439/76.1; 439/64; 361/752; 361/756

(58) Field of Classification Search .............. 439/76.1, 439/892, 64; 361/752, 756, 758, 736
See application file for complete search history.

(56) References Cited

U.S. PATENT DOCUMENTS

| | | | |
|---|---|---|---|
| 3,476,982 A | 11/1969 | Bell et al. ............... 361/802 |
| 4,994,937 A * | 2/1991 | Morrison ................ 361/715 |
| 5,757,617 A * | 5/1998 | Sherry .................... 361/685 |
| 6,145,748 A * | 11/2000 | Neifer et al. ............ 235/486 |
| 6,178,094 B1 * | 1/2001 | Hakozaki ................ 361/796 |
| 6,282,099 B1 * | 8/2001 | Wilson et al. .......... 361/753 |
| 6,821,141 B1 * | 11/2004 | Liu ......................... 439/377 |
| 6,950,311 B1 * | 9/2005 | DeCesare et al. ...... 361/727 |
| 2001/0017767 A1 | 8/2001 | Kitamura et al. ...... 361/752 |
| 2003/0002266 A1 * | 1/2003 | Miller et al. ........... 361/756 |
| 2003/0151903 A1 * | 8/2003 | Brooks et al. .......... 361/756 |
| 2004/0037054 A1 * | 2/2004 | Ice .......................... 361/752 |

FOREIGN PATENT DOCUMENTS

JP 2001-237557 8/2001

* cited by examiner

*Primary Examiner*—Michael C. Zarroli
(74) *Attorney, Agent, or Firm*—Squire, Sanders & Dempsey LLP

(57) ABSTRACT

In a housing case for an electronic circuit board on which components such as connectors are mounted, there are provided a pair of guide rails that form a guide path when the board is inserted in the case and a holder holding the connectors mounted on the board, and the guide rails are disposed in a position that does not interfere with the board when the connector is held by the holder, thereby enabling to easily receive the board to be accurately fixed at a predetermined position, while preventing an excessive twisting/shaking force from concentrating at a joint where components are joined to the board, when mating connector is inserted to or removed from the connectors.

18 Claims, 4 Drawing Sheets

HOUSING CASE FOR ELECTRONIC CIRCUIT BOARD

BACKGROUND OF THE INVENTION

1. Field of the Invention

The present invention relates to a housing case for an electronic circuit board, more particularly to a housing case for an electronic circuit board provided with a pair of guide rails that form a guide path for guiding the electronic circuit board.

2. Description of the Related Art

Conventionally, the housing cases for housing the electronic circuit boards on which connectors, electronic parts and other components are integrally mounted or fixed are configured such that the electronic circuit board can be easily inserted and fixed at a predetermined position in the housing case, as disclosed, for example, in Japanese Laid-Open Patent Application No. 2001-237557 (from paragraph 0031 to 0034, FIG. 1, etc.).

Specifically, in the technique taught in '557, the connectors are fixed on the electronic circuit board by soldering the distal portions of connection terminals of the connectors on the board, and two rails are formed so as to face each other on the internal wall surface of the housing case in which the electronic circuit board is to be inserted. In addition, flange-like projections are formed on the surfaces of the connectors that are in contact with the housing case (i.e., surfaces opposite to the surface facing the electronic circuit board), and recesses are formed in the housing case for engagement with the projections.

When the electronic circuit board is inserted between the rails and fixed at a predetermined position in the housing case, the projections engage the recesses. The electronic circuit board is thereby easily inserted and accurately fixed at a predetermined position in the housing case.

However, at a time when the electronic circuit board is housed in the housing case taught in '557, when mating connectors are to be inserted or removed from the connectors mounted on the electronic circuit board, it produces a twisting/shaking force that will then be applied or transmitted to the electronic circuit board.

Since the spacing (groove width) of the rails holding the electronic circuit board is substantially the same as the thickness of the electronic circuit board (more precisely equal to the board thickness plus about 0.1 mm), the electronic circuit board can hardly move in the direction in which the twisting/shaking force acts, whereby the twisting/shaking force concentrates at the joints (soldered portions) where the components such as connectors are joined to the electronic circuit board. The twisting/shaking force disadvantageously acts to increase the stress on the joints, thereby rendering the electrical connections between the connectors and the electronic circuit board unstable.

SUMMARY OF THE INVENTION

Therefore, an object of the present invention is to solve the above-described drawback and to provide a housing case for an electronic circuit board which can easily receive the electronic circuit board to be accurately fixed at a predetermined position, while preventing an excessive twisting/shaking force from concentrating at a joint where components are joined to the electronic circuit board, when mating connector is inserted to or removed from the components.

In order to achieve the object, the present invention provides a housing case for housing an electronic circuit board on which components are mounted, comprising: a guide rail that forms a guide path when the electronic circuit board is inserted in the case, and a holder holding at least one of the components mounted on the electronic circuit board, and wherein the guide rail is disposed in a position that does not interfere with the electronic circuit board when the one of the components is held by the holder.

DETAILED DESCRIPTION OF THE PREFERRED EMBODIMENT

The preferred embodiment of a housing case for an electronic circuit board according to the present invention will be described below with reference to the attached drawings.

Figure 1:
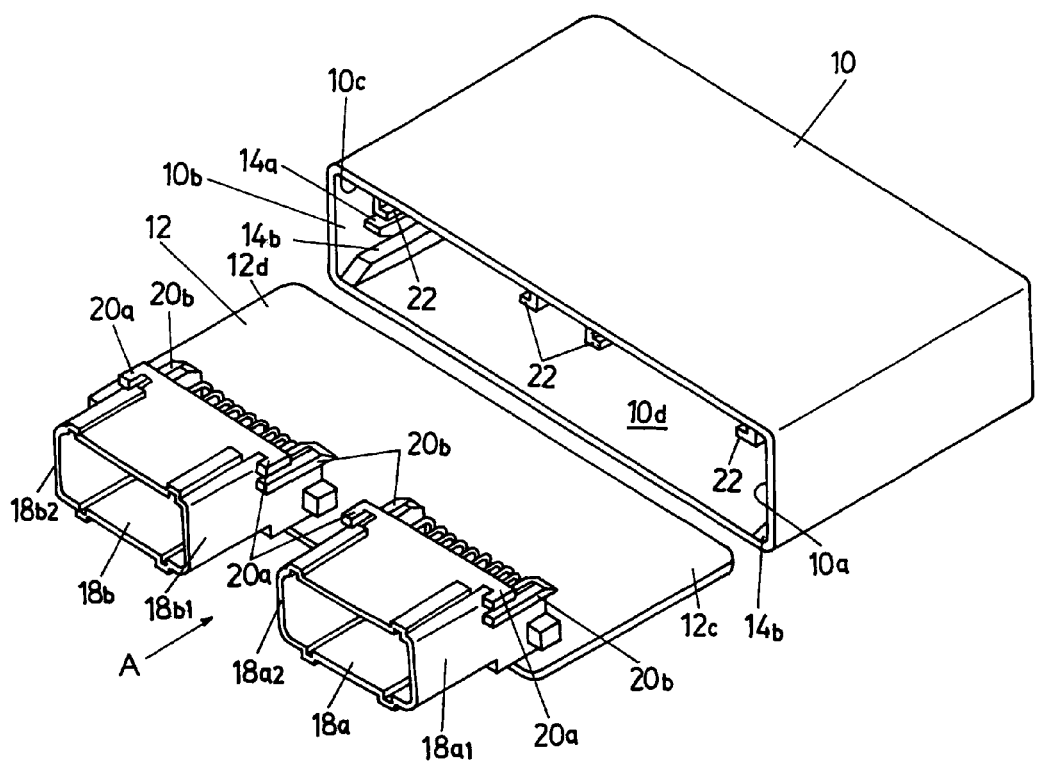
FIG. 1 is a perspective view showing a housing case for an electronic circuit board according to an embodiment of the present invention, and the electronic circuit board on which connectors and other components are mounted.
Figure 2:
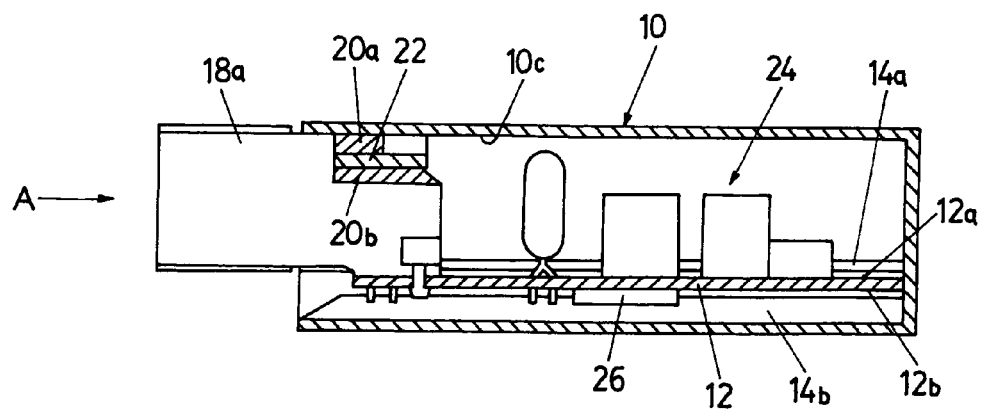
FIG. 2 is a cross-sectional schematic view showing the electronic circuit board, illustrated in FIG. 1, on which the connectors and other components are mounted, housed in the housing case.

FIG. 1 is a perspective view showing a housing case for the electronic circuit board according to an embodiment of the present invention, and the electronic circuit board on which connectors are mounted; and FIG. 2 is a cross-sectional schematic view showing the electronic circuit board, illustrated in FIG. 1, on which the connectors and other components are mounted, housed in the housing case.

The housing case 10 has a substantially rectangular (tube-like) shape that is opened at one end and is made of resin. Two (a pair of) guide rails 14a and 14b that form a guide path for guiding the electronic circuit board (hereinafter simply referred to as "board") 12 are respectively formed on the inside walls 10a and 10b of the side surfaces (side surfaces when viewed from the insertion direction (direction of arrow A)) of the housing case 10 (The guide rail of the upper portion in the vertical direction is designated 14a, and the guide rail of the lower portion is designated 14b).

The guide rails 14a and 14b are substantially made parallel with the insertion direction (direction of arrow A), as shown in FIG. 2, and are formed so as to reach the inside surface of the rear side (opposite side of the opening) of the housing case 10. The ends of the guide rails 14a and 14b (near the opening of the housing case 10) are formed in tapered fashion so as to allow the board 12 to be easily inserted.

The spacing (groove width) between the guide rails 14a and 14b, more specifically the distance from the lower surface of the guide rail 14a to the upper surface of the guide rail 14b is set to a predetermined value that is sufficiently greater than the thickness (height) of the board 12 (specifically, substantially twice the thickness of the board 12).

A plurality of (specifically, four) projections (holders) 22 that are sandwiched (engaged) by connector-side rails 20a and 20b (described later) of the connectors 18a and 18b are provided on the upper surface (ceiling surface) 10c of the internal wall of the housing case 10 in the vicinity of the opening. The projections 22 have an L shape or an inverted L shape in cross section, and the length, width, and thickness (height) thereof (with respect to the insertion direction) are appropriately determined taking into account the twisting/shaking force applied to the projections 22 when inserting mating connectors (not illustrated) thereto or removing therefrom.

The board 12 will be described next.

Mounted (installed) on the board 12 are connectors 18a and 18b that are components (electronic parts) and are mechanically and electrically connected to external equipment (not illustrated) through the mating connectors or the like. IC chips, capacitors, and other components (generally assigned with reference numeral 24) are mounted on a top surface 12a of the board 12, as shown in FIG. 2, and components (also generally assigned with reference numeral 26) are mounted on a bottom surface 12b. In the figure, the components mounted on the board 12 are omitted from illustration except for those required for description. The connection terminals disposed inside the connectors 18a and 18b are also omitted from illustration.

The connector 18a (18b) mounted on the board 12 is made of resin, and a pair of connector-side rails 20a and 20b parallel to the insertion direction are integrally provided on the external walls of the connector 18a (18b), specifically to the side walls 18a1 and 18a2 (18b1 and 18b2) on the two sides constituting the side surfaces of the connector 18a (18b) when viewed from the insertion direction (direction of arrow A) with respect to the housing case 10, as shown in FIG. 1 (The connector-side rail of the upper portion in the vertical direction is designated 20a, and the connector-side rail of the lower portion is designated 20b).

The spacing between the connector-side rails 20a and 20b, more specifically, the distance from the lower surface of the connector-side rails 20a to the upper surface of the connector-side rails 20b is appropriately determined in accordance with the size (thickness) of the projections 22 that protrude from the housing case 10. The connector-side rails 20b are formed so as to have substantially twice the length of the connector-side rails 20a, and the distal portions thereof (distal sides in the insertion direction) are formed with a tapered shape.

The length, width, and thickness (height) of the connector-side rails 20a and 20b (with respect to the insertion direction) are appropriately determined taking into account the twisting/shaking force applied to the connector-side rails 20a and 20b when inserting and removing the mating connectors (not illustrated).

Figure 3:
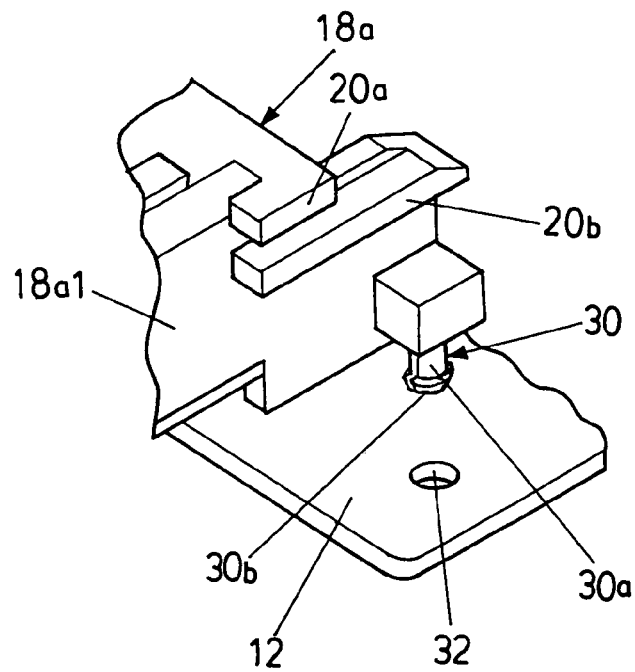
FIG. 3 is a partial enlarged perspective view showing the state prior to one of the connectors illustrated in FIG. 1 being mounted (fixed) on the board.
Figure 4:
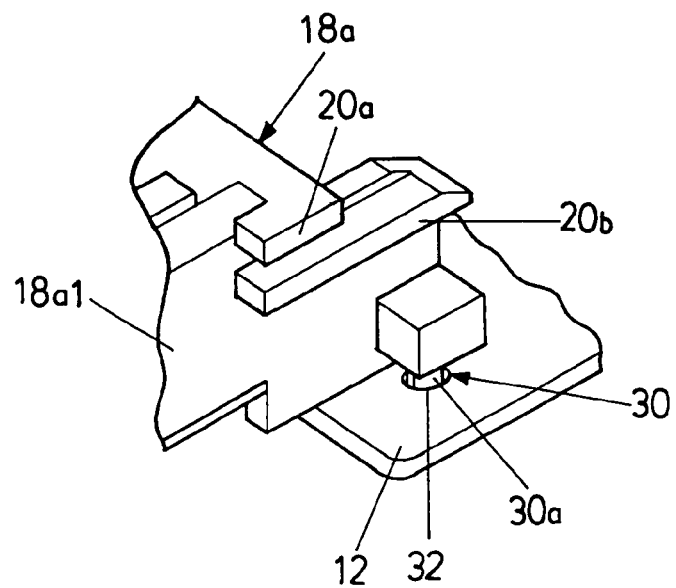
FIG. 4 is a partial enlarged perspective view, similar to FIG. 3, showing the state that one of the connectors shown in FIG. 1 is mounted (fixed) on the board.

FIG. 3 is a partial enlarged perspective view showing the state that the connector 18a is mounted (fixed) on the board 12, and FIG. 4 is a partial enlarged perspective view similar to FIG. 3, showing the state prior to the connector 18a being mounted (fixed) on the board 12.

As shown in FIGS. 3 and 4, a resin claw (or leg) 30 is formed at the lower portion of the side wall 18a1 of the connector 18a and a claw engagement hole 32 with which the resin claw 30 is to be engaged is formed at a position on the board 12 where the engagement with the resin claw 30 is possible.

Following is a description of the shapes and fixing of the resin claw 30 and the claw engagement hole 32.

Figure 5:
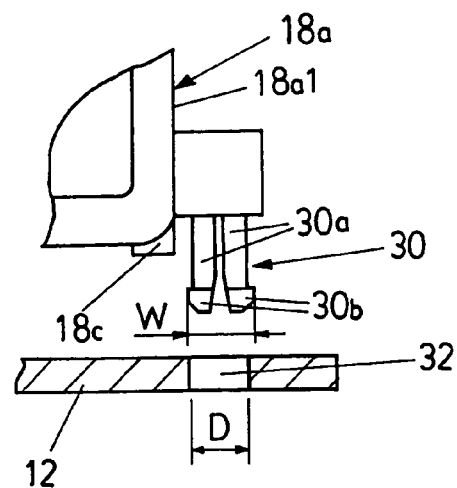
FIG. 5 is a schematic view showing, with the board cross-sectioned, the state prior to a resin claw of the connector being installed on the board.
Figure 6:
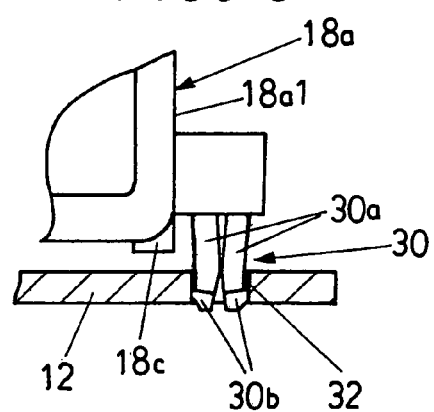
FIG. 6 is a schematic view, similar to FIG. 5, showing the state in which the resin claw of the connector is being inserted into a claw engagement hole of the board.
Figure 7:
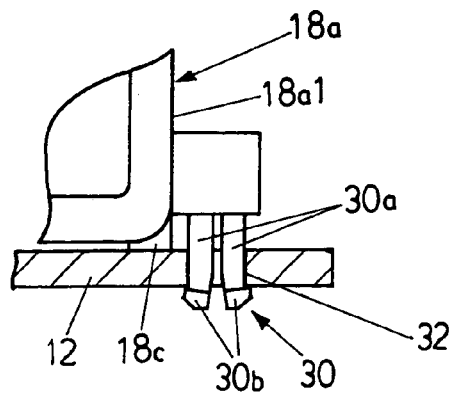
FIG. 7 is a schematic view, similar to FIG. 5, showing the state in which the resin claw of the connector is completely inserted into the claw engagement hole of the board.

FIG. 5 is a schematic view showing, with the board cross-sectioned, the state prior to the resin claw 30 of the connector 18a being installed on the board 12, FIG. 6 is a schematic view showing the state in which the resin claw 30 of the connector 18a is being inserted into the claw engagement hole 32 of the board 12, and FIG. 7 is a schematic view showing the state in which the resin claw 30 of the connector 18a is completely inserted into the claw engagement hole 32 of the board 12.

As shown in FIG. 5, the resin claw 30 is shaped as a cylinder divided into two sections (half cylindrical shape) along the center in the radial direction. The claw has a plurality of (specifically, two) elastically deformable leg portions 30a and also has claw portions 30b formed on the distal portions (lower end portions) of the leg portions 30a, as shown in FIG. 5.

The external dimension in the width direction of the resin claw 30 in the free state, shown in FIG. 5, more specifically, the external dimension W of the claw portions 30b is made slightly larger than the diameter D of the claw engagement hole 32 on the board 12. When the connector 18a is fixed to the board 12, the resin claw 30 of the connector 18a is positioned above the claw engagement hole 32 of the board 12 (also refer to FIG. 3), and the resin claw 30 is thereafter inserted in the claw engagement hole 32.

Then, the resin claw 30 is inserted into the claw engagement hole 32 as the spacing (gap) between leg portions 30a of the resin claw 30 is narrowed, in other words, while the resin claw 30 (leg portions 30a) undergoes elastic deformation, as shown in FIG. 6.

When the claw portions 30b reach the lower side of the claw engagement hole 32, the leg portions 30a that have been narrowed by being restricted in the claw engagement hole 32 (pressed by the edge of the claw engagement hole 32 and deformed inward) are spread apart, as illustrated in the figure, by the elastic force possessed by the resin material itself, and the claw portions 30b of the leg portions 30a are engaged (stopped) by the edge of the claw engagement hole 32 on the lower side of the board 12, as shown in FIG. 7.

The resin claw 30 of the connector 18a is shown in FIGS. 3 to 7 only for one side wall 18a1 of the connector 18a, but a similar resin claw 30 is also formed on the side wall 18a2 on the opposite side, and a claw engagement hole 32 corresponding thereto is formed in the board 12. The other connector 18b also has the same configuration as described above. The resin claws 30 and the claw engagement holes 32 are brought into engagement with each other along the respective side walls of the connectors 18a and 18b, in other words, at a total of four locations. The board 12 and the connectors 18a and 18b are thus fixed by the resin claws 30 and the claw engagement holes 32, and are further fixed by soldering the connection terminals of the connectors 18a and 18b to the board 12.

Projections 18c formed on the lower surface of the connector 18a (18b) are adapted to be in contact with the upper surface of the board 12, as shown in FIG. 7, when the connector 18a (18b) is fixed to the board 12, so that the connector 18a (18b) is more stably fixed.

Subsequently described is the state in which the board 12 (with the connectors 18a and 18b mounted thereon) is fixed in the housing case 10.

The characteristic feature of the present invention is that the guide rails 14a and 14b are configured so as to be disposed in a position that does not interfere with the board 12 when the connectors 18a and 18b (connector-side rails 20a and 20b) are each held by the projections 22.

More specifically, the board 12 (both edges 12c and 12d of the board 12) is inserted in the housing case 10 as being guided by the pair of guide rails 14a and 14b. The board 12 is thereafter fixed at a predetermined position in the housing case 10, as shown in FIG. 2, and the connector-side rails 20a and 20b of the connector 18a (18b) are engaged with the projections 22 on the housing case 10. Therefore, the connector 18a (18b) and the board 12 are held or fixed in a predetermined position in the housing case 10 by the connector-side rails 20a and 20b and the projections 22.

In the above-described state, since the board 12 is configured so as to avoid interference from the guide rails 14a and 14b. In other words, the spacing (groove width) of the guide rails 14a and 14b has a predetermined value that is sufficiently larger than the thickness (height) of the board 12 as described above, the position of the board 12 can be positioned near the center between the guide rails 14a and 14b as shown in FIG. 2. The board 12 is thereby configured so as to be freely movable within an allowed range between the guide rails 14a and 14b without interference from the guide rails 14a and 14b.

The position in which the guide rails 14a and 14b are formed will be described in further detail below.

Figure 8:
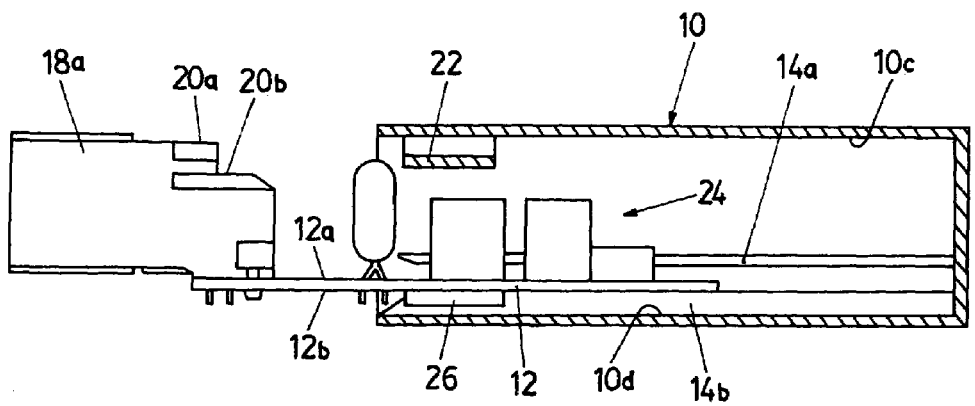
FIG. 8 is a partial cross-section showing the process in which the board illustrated in FIG. 1 is being inserted into the housing case.

The guide rail 14b is positioned such that the components 26 mounted on the lower surface 12b of the board 12 do not interfere (do not make contact) with the bottom surface 10d of the housing case 10 in the insertion process, even when the board 12 is inserted in the housing case 10 while bringing its lower surface 12b into contact with the upper surface of the guide rail 14b, as shown in FIG. 8.

Figure 9:
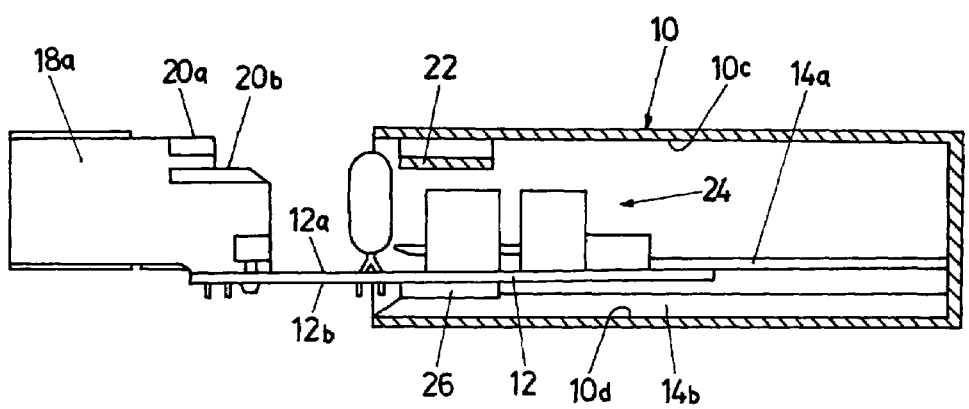
FIG. 9 is a partial cross-section, similar to FIG. 8, showing the process in which the board shown in FIG. 1 is being inserted into the housing case.

Similarly, the guide rail 14a is positioned such that the components 24 mounted on the upper surface 12a of the board 12 do not interfere (do not make contact) with the ceiling surface 10c of the housing case 10 in the insertion process, even when the board 12 is inserted in the housing case 10 while bringing its upper surface 12a into contact with the lower surface of the guide rail 14a, as shown in FIG. 9.

Thus, in the embodiment, the housing case (10) for housing an electronic circuit board (12) on which components (18a, 18b) are mounted, having a guide rail (14a, 14b) that forms a guide path when the electronic circuit board is inserted in the case, characterized in that: a holder (projections 22) is provided holding at least one of the components mounted on the electronic circuit board, and that the guide rail (14a, 14b) is disposed in a position that does not interfere with the electronic circuit board when the one of the components is held by the holder, whereby the board 12 on which the connectors 18a and 18b are mounted can be inserted in the housing case 10 with ease and is accuracy fixed at a predetermined position. In addition, the board 12 and guide rails 14a and 14b are configured so as to avoid interference by setting the groove width between the guide rails 14a and 14b to a predetermined value that is sufficiently larger than the board thickness, rather than to a value substantially equal to the thickness of the board (for example, board thickness plus about 0.1 mm) as in a conventional housing case. Accordingly, when the mating connectors or other mating components are inserted to or removed from the connectors 18a and 18b or other mounted components on the board 12, the board 12 can be moved within an allowed range between the guide rails 14a and 14b. A large twisting/shaking force (stress) is thereby prevented from concentrating at the joints where the mounted components (18a and 18b) are joined to the board 12, and the electrical connections between the mounted components and electronic circuit board can be stabilized.

Further, since it is configured such that the connector has a connector-side rail (20a, 20b), and the holder comprises a projection (22) to be engaged with the connector-side rail, in addition to the above-described effects, the board 12 can be moved within an allowed range between the guide rails 14a and 14b when the mating connectors are inserted to or removed from the connectors 18a, 18b on the board 12. A large twisting/shaking force (stress) is thereby prevented from concentrating at the joints between the board 12 and the mounted components 18a and 18b, and the electrical connections between the board 12 and the mounted components 18a and 18b can be stabilized.

Furthermore, since it is configured such that a pair of connector-side rails 20a and 20b are formed on each of the connectors 18a and 18b and the holding portions (22) are projections to hold the connector-side rails 20a and 20b, in addition to the above-described effects, the board 12 on which the connectors 18a and 18b are mounted can be positioned and held (fixed) with greater reliability in a predetermined position in the housing case 10.

It should be noted that, in the configuration described above, although two connector-side rails 20a and 20b are formed on the connector 18a (18b) and a single projection 22 is formed on the housing case 10 so as to engage each other, a reverse configuration may also be adapted in which a single connector-side rail and two projections in the shape of a rail engage each other.

It should further be noted that, although the four projections 22 are provided in correspondence with the connector-side rails 20a and 20b of the connector 18a (18b), a configuration may also be adopted in which the projections 22 (projections 22 that correspond to the side walls 18a2 and 18b1) located in the center of the ceiling surface 10c of the housing case 10 are eliminated, and the connector 18a (18b) is positioned and held solely with two projections 22 (projections 22 that correspond to the side walls 18a1 and 18b2) located on the outermost side in order to allow a tall component 24 to be mounted in the center of the board 12.

It should further be noted that, although the holding portions for holding the mounted components on the board 12 are configured as projections 22, the present invention is not limited to the projection form and any other shape may be used as long as the holding portions function to hold mounted components on the board 12.

Although it is configured such that two connectors 18a and 18b are mounted on the board 12, the connector may be one or three or more.

Although it is configured such that the board 12 and the connectors 18a and 18b are fixed by the resin claws 30 and claw engagement holes 32, these may also be fastened together using a screw or the like instead.

Although the spacing between the pair of guide rails 14a and 14b is configured to be substantially double the thickness (height) of the board 12, it is apparent that the present invention is not limited thereby.

Although the connector-side rails 20b are configured so as to be substantially double the length of the connector-side rails 20*a*, it is apparent that the lengths of the connector-side rails 20*a* and 20*b* can be appropriately modified.

Japanese Patent Application No. 2004-186621 filed on Jun. 24, 2004, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A housing case for housing an electronic circuit board on which components are mounted, comprising:
   a guide rail that forms a guide path when the electronic circuit board is inserted in the case, and
   a holder holding at least one of the components mounted on the electronic circuit board,
   and wherein the guide rail is disposed in a position that does not contact with the electronic circuit board when the one of the components is held by the holder.

2. The housing case according to claim 1, wherein the one of the components held by the holder is a connector.

3. The housing case according to claim 2, wherein the connector has a connector-side rail, and the holder comprises a projection to be engaged with the connector-side rail.

4. The housing case according to claim 3, wherein the connector-side rail comprises a pair of rails such that the projection is sandwiched by connector-side rails.

5. The housing case according to claim 1, wherein the guide rail comprises a pair of rails whose spacing is set to a predetermined value that is greater than the thickness of the electric circuit board.

6. The housing case according to claim 5, wherein the predetermined value is a value substantially twice the thickness of the electric circuit board.

7. A housing case for housing an electronic circuit board on which components are mounted, comprising:
   guide means for providing a guide path when the electronic circuit board is inserted in the case, and
   holder means for holding at least one of the components mounted on the electronic circuit board,
   and wherein the guide means is disposed in a position that does not contact with the electronic circuit board when the one of the components is held by the holder means.

8. The housing case according to claim 7, wherein the one of the components held by the holder means is a connector means for connecting the component to another component.

9. The housing case according to claim 8, wherein the connector means comprises a connector-side rail, and the holder means comprises a projection to be engaged with the connector-side rail.

10. The housing case according to claim 9, wherein the connector-side rail comprises a pair of rails such that the projection is sandwiched by connector-side rails.

11. The housing case according to claim 7, wherein the guide means comprises a pair of rails whose spacing is set to a predetermined value that is greater than the thickness of the electric circuit board.

12. The housing case according to claim 11, wherein the predetermined value is a value substantially twice the thickness of the electric circuit board.

13. A method of manufacturing a housing case for housing an electronic circuit board on which components are mounted, the method comprising:
   disposing, in the housing case, a guide rail that forms a guide path when the electronic circuit board is inserted in the case, and
   disposing, in the housing case, a holder configured to hold at least one of the components mounted on the electronic circuit board,
   and wherein the guide rail and the holder are disposed in a relative position such that the guide rail does not contact with the electronic circuit board when the one of the components is held by the holder.

14. The method according to claim 13, wherein the one of the components held by the holder is a connector.

15. The method according to claim 14, wherein the connector has a connector-side rail, and the holder comprises a projection to be engaged with the connector-side rail.

16. The method according to claim 15, wherein the connector-side rail comprises a pair of rails such that the projection is sandwiched by connector-side rails.

17. The method according to claim 13, wherein the guide rail comprises a pair of rails whose spacing is set to a predetermined value that is greater than the thickness of the electric circuit board.

18. The method according to claim 17, wherein the predetermined value is a value substantially twice the thickness of the electric circuit board.

* * * * *